(12) United States Patent
Park

(10) Patent No.: US 12,245,388 B2
(45) Date of Patent: Mar. 4, 2025

(54) POWER MODULE

(71) Applicant: LG INNOTEK CO., LTD., Seoul (KR)

(72) Inventor: Sung June Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 269 days.

(21) Appl. No.: 18/018,006

(22) PCT Filed: Aug. 2, 2021

(86) PCT No.: PCT/KR2021/010053
§ 371 (c)(1),
(2) Date: Jan. 25, 2023

(87) PCT Pub. No.: WO2022/025730
PCT Pub. Date: Feb. 3, 2022

(65) Prior Publication Data
US 2023/0276587 A1 Aug. 31, 2023

(30) Foreign Application Priority Data
Jul. 31, 2020 (KR) .................. 10-2020-0095711

(51) Int. Cl.
*H05K 5/00* (2006.01)
*H02M 7/00* (2006.01)
*H05K 5/02* (2006.01)
*H05K 7/20* (2006.01)

(52) U.S. Cl.
CPC ............ *H05K 5/023* (2013.01); *H02M 7/003* (2013.01); *H05K 5/0247* (2013.01); *H05K 7/20* (2013.01)

(58) Field of Classification Search
CPC ........ H05K 5/023; H05K 5/0247; H05K 7/20; H02M 7/003
USPC ........................................................ 361/695
See application file for complete search history.

(56) References Cited

U.S. PATENT DOCUMENTS

| | | | |
|---|---|---|---|
| 5,695,367 A * | 12/1997 | Takano | H01R 13/743 439/699.2 |
| 2015/0208544 A1* | 7/2015 | Liao | H05K 7/1492 361/679.01 |
| 2017/0017276 A1* | 1/2017 | Ganta | H05K 5/0247 |
| 2019/0132967 A1* | 5/2019 | Lu | H05K 5/0204 |

FOREIGN PATENT DOCUMENTS

| KR | 20-1994-0001646 Y1 | 3/1994 |
|---|---|---|
| KR | 10-0159151 B1 | 2/1999 |

* cited by examiner

*Primary Examiner* — Zhengfu J Feng
(74) *Attorney, Agent, or Firm* — Birch, Stewart, Kolasch & Birch, LLP

(57) ABSTRACT

The present embodiment relates to a power module comprising: a power module frame including side plates and a lower plate; a bracket having bracket hooks coupled to the side plates; a light-emitting device coupled to the bracket; and a lever arranged on the lower plate, wherein the side plates include a bracket groove, to which the bracket hook is coupled, and a lever groove through which a part of the lever passes, the lever includes a first plate having a lever hook inserted in the lever groove, a second plate connected perpendicularly to the first plate, and a handle connected to the second plate.

20 Claims, 5 Drawing Sheets

POWER MODULE

CROSS REFERENCE TO RELATED APPLICATIONS

This application is the National Phase of PCT International Application No. PCT/KR2021/010053, filed on Aug. 2, 2021, which claims priority under 35 U.S.C. 119 (a) to Patent Application No. 10-2020-0095711, filed in the Republic of Korea on Jul. 31, 2020, all of which are hereby expressly incorporated by reference into the present application.

TECHNICAL FIELD

The present embodiment is related to a power module.

BACKGROUND ART

In general, a power supply unit device is widely used as a power supply device. Components such as a fan module, an AC socket, a PFC switch, and a DCDC converter are mounted on the power supply unit.

Recently, as the power capacity of a power supply device increases, the application of a large AC socket is required. As AC sockets become larger, there is not enough space to mount LEDs and levers compared to the existing ones, so the need to change the structure of each component and change the arrangement of each component has increased.

DETAILED DESCRIPTION OF THE INVENTION

Technical Subject

Through present embodiment, it is to provide a power module in which a lever and an LED are arranged while applying a large size AC socket.

Technical Solution

The power module according to the present embodiment comprises: a power module frame including side plates and a lower plate; a bracket having bracket hooks coupled to the side plates; a light-emitting device coupled to the bracket; and a lever arranged on the lower plate, wherein the side plates include a bracket groove, to which the bracket hook is coupled, and a lever groove through which a part of the lever passes, the lever includes a first plate having a lever hook inserted in the lever groove, a second plate connected perpendicularly to the first plate, and a handle connected to the second plate.

In addition, the power module includes an AC socket, the bracket and the first plate of the lever are in contact with a first surface of the AC socket, and the second plate of the lever may be in contact with a second surface of the AC socket.

In addition, the lever may include a third plate being disposed between the second plate and the handle, and the third plate may include a holding portion being formed in a direction perpendicular to the third plate.

In addition, when AC power is disconnected from the AC socket, the lever can move in a direction perpendicular to the side plate of the power module, and when the AC power is coupled to the AC socket, the movement of the lever may be limited by the holding portion.

In addition, the AC socket is disposed being spaced apart from the side plate of the power module by a predetermined distance, and the predetermined distance may be greater than the length at which the lever hook is protruded from the first plate in in a direction perpendicular to the first plate.

In addition, the first plate may be disposed between a lower plate of the power module frame and the AC socket.

In addition, the bracket coupling plate in which the bracket groove is formed may be formed by being protruded inward from the side plate of the power module.

In addition, the bracket hook is formed on at least one of an upper surface and a lower surface of the bracket, and the bracket may include a tension groove being formed at predetermined intervals between at least one of the upper surface and lower surface of the bracket and a body of the bracket.

In addition, the bracket may include a fixing groove into which the flange of the light emitting device is inserted and fixed.

In addition, the bracket hook may be formed with a downwardly inclined surface in a direction in which the bracket is slidingly coupled with the power module frame.

Advantageous Effects

Through present embodiment, it is possible to provide a power module that can efficiently arrange LEDs and levers within a narrow space compared to the existing ones while applying a large size AC socket.

In addition, LED can be used as a general purpose product without being manufactured in a separate modular form, which can be advantageous for cost reduction and product commonality.

In addition, it is possible to provide a power module that is easily assembled by bending the power module frame and using a bracket that is easy to combine.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Hereinafter, a power module 10 according to an embodiment of the present invention will be described in more detail with reference to the accompanying drawings.

Figure 1:
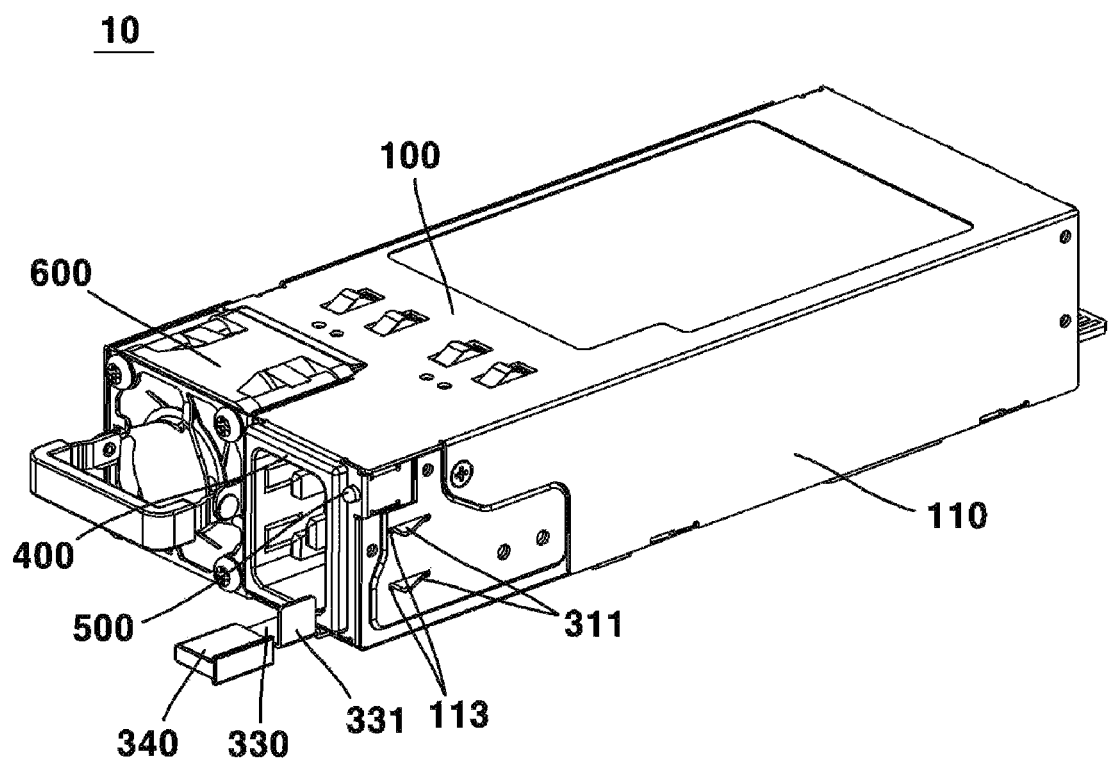
FIG. 1 is a perspective view of a power module according to a present embodiment.
Figure 2:
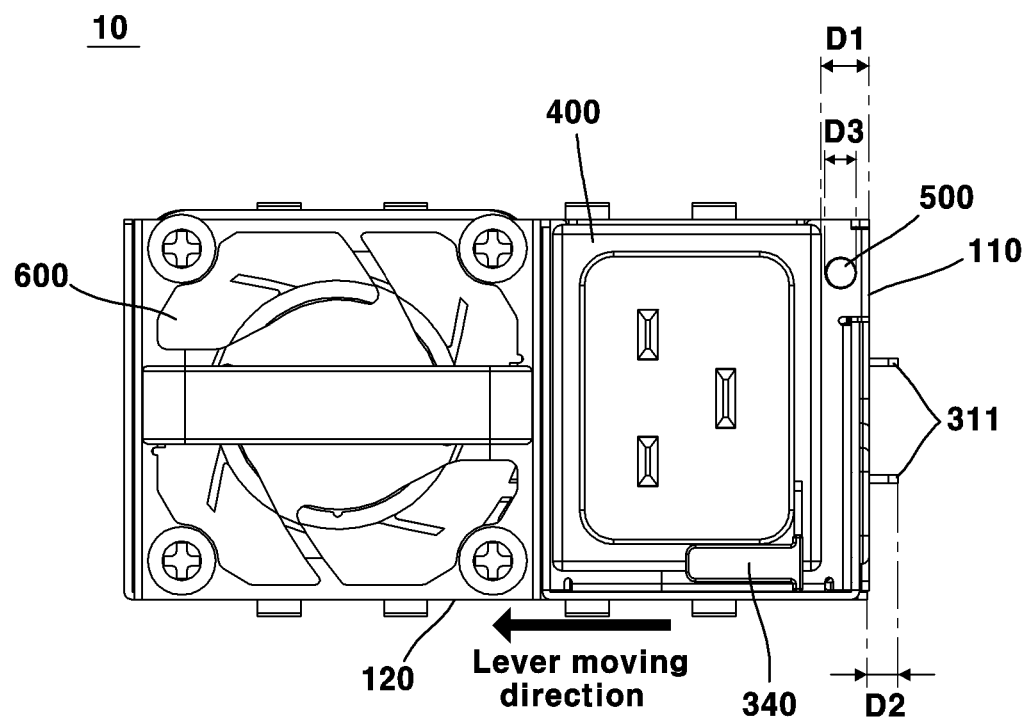
FIG. 2 is a front view of a power module according to a present embodiment.
Figure 3:
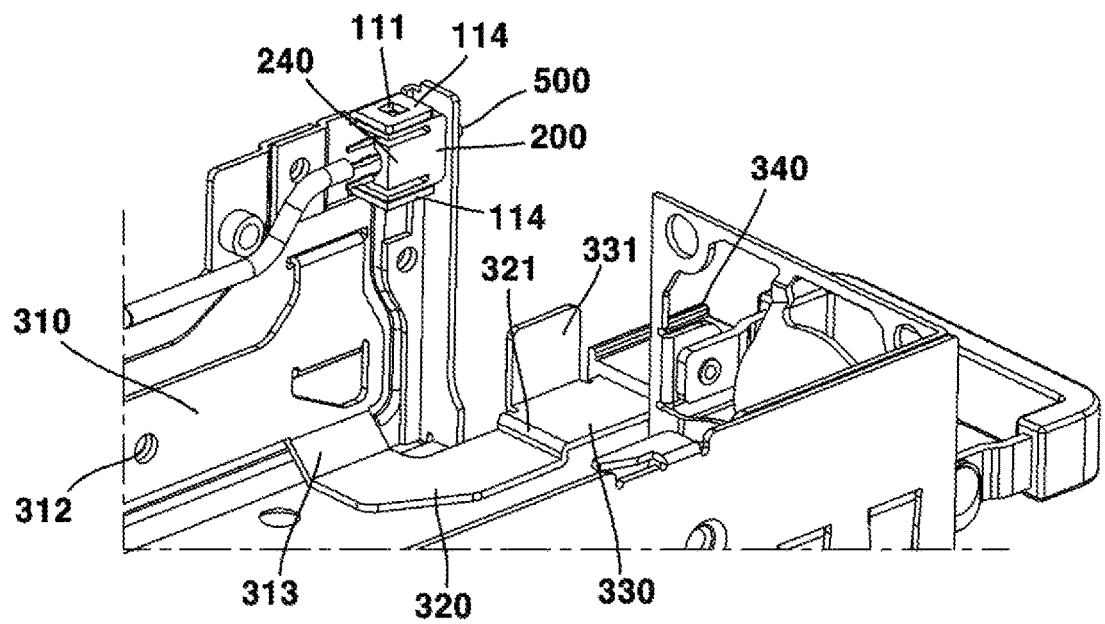
FIG. 3 is a perspective view of some components of a power module according to the present embodiment.
Figure 4:
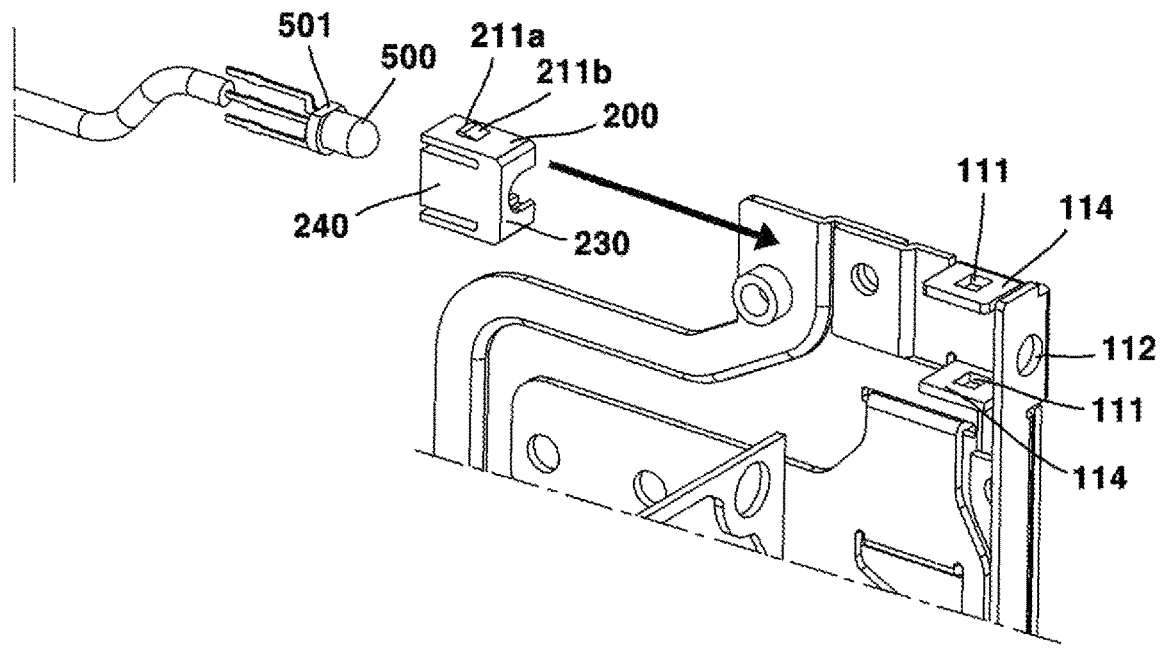
FIG. 4 is an exploded perspective view of a bracket according to the present embodiment.
Figure 5:
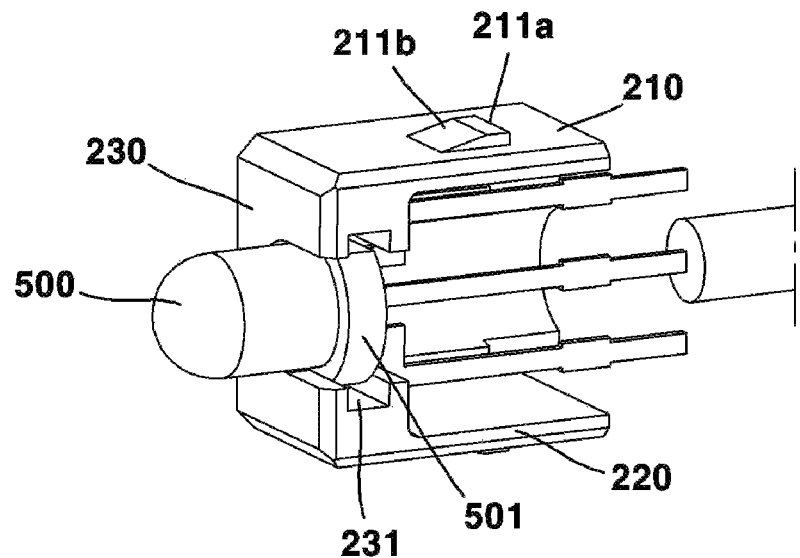
FIG. 5 is a perspective view of a bracket according to the present embodiment.
Figure 6:
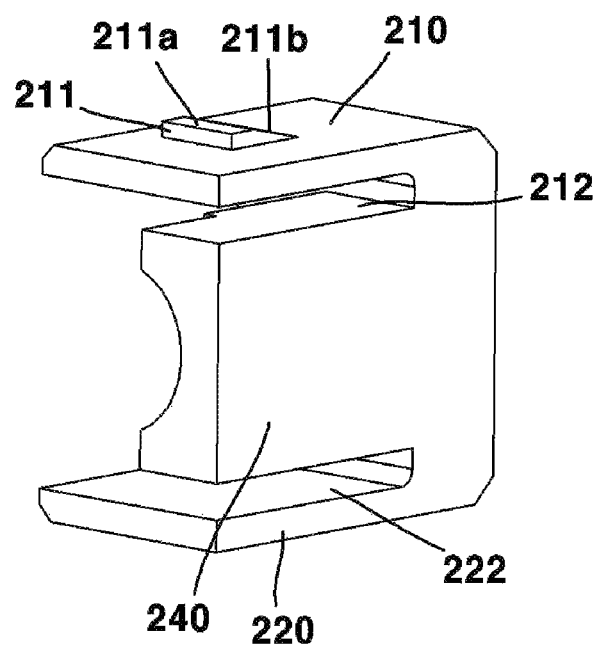
FIG. 6 is a perspective view of a bracket viewed from another angle according to the present embodiment.
Figure 7:
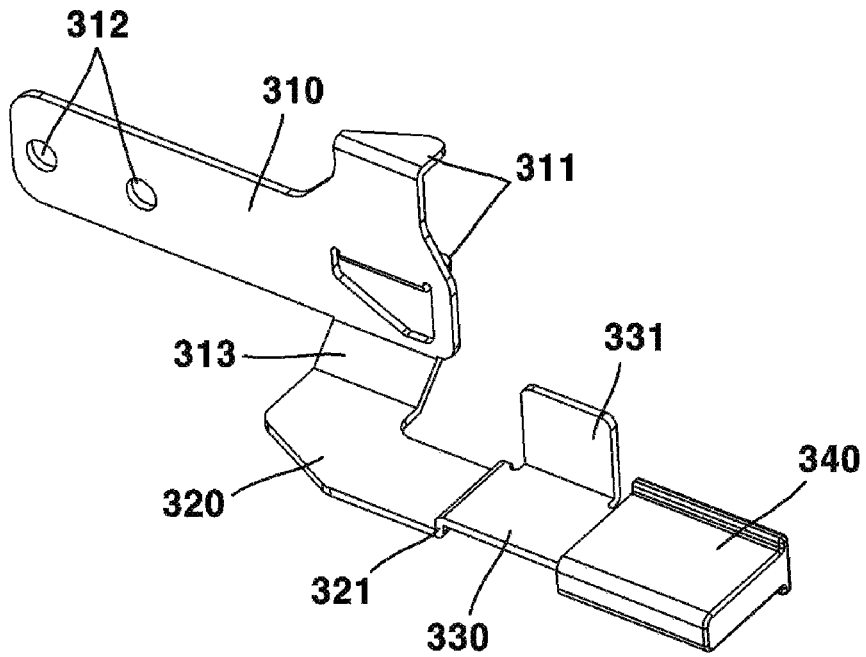
FIG. 7 is a perspective view of a lever according to the present embodiment.

FIG. 1 is a perspective view of a power module according to a present embodiment; FIG. 2 is a front view of a power module according to a present embodiment; FIG. 3 is a perspective view of some components of a power module according to the present embodiment; FIG. 4 is an exploded perspective view of a bracket according to the present embodiment; FIG. 5 is a perspective view of a bracket according to the present embodiment; FIG. 6 is a perspective view of a bracket viewed from another angle according to the present embodiment; FIG. 7 is a perspective view of a lever according to the present embodiment; and FIG. 8 is a cross-sectional view of a power module according to a present embodiment.

The power module 10 according to an embodiment of the present invention may be a power supply device. The power module 10 may be a power supply unit (PSU). The power module 10 may be a power circuit device that generates required output power from input power. The power module 10 is a device that supplies power necessary for driving the server, and may be a device that converts input commercial AC power into DC power required for the server and outputs the converted power. The power module 10 may be used in a server, storage, rack, and network equipment included in a data center.

Figure 8:
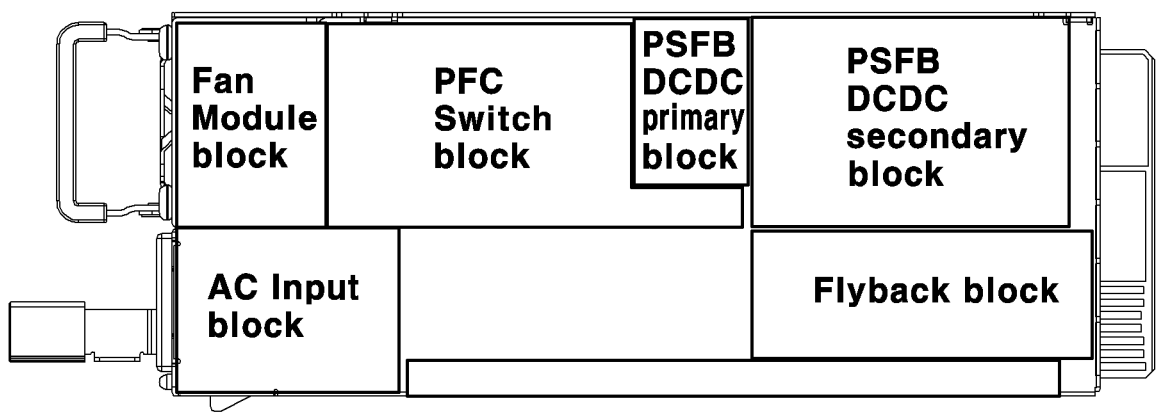
FIG. 8 is a cross-sectional view of a power module according to a present embodiment.

Referring to FIG. 8 illustrating a cross-sectional view of a power module 10, the power module 10 may include components such as a fan module, an AC socket, a PFC switch, a PSFP DCDC converter, and a flyback converter, and according to the size and mounting position, each component can affect each other. Accordingly, the overall size of the power module 10 may vary.

The power module 10 may include a power module frame 100. The power module frame 100 may form the outer appearance of the power module 10. The power module frame 100 may be formed in a hexahedral shape. However, it is not limited thereto and the shape of the power module frame 100 may be variously changed.

The power module frame 100 may include a side plate 110 and a lower plate 120. The side plate 110 and the lower plate 120 may be disposed perpendicular to each other. The side plate 110 and the lower plate 120 may be fixed by welding or screw-coupling of separate plates. The side plate 110 and the lower plate 120 may be fixed by welding or screw-coupling by bending the planar figure of the power module frame 100 being formed of a single plate.

An AC socket 400 and a fan module 600 may be disposed at the front part of the power module frame 100. The length of the side plate 110 of the power module frame in a direction perpendicular to the ground, and the length of the lower plate 120 in a direction perpendicular to the side plate 110 may vary depending on the size of the AC socket 400 and fan module 600.

Referring to FIG. 2 illustrating a front view of the power module 10, a fan module 600 and an AC socket 400 may be disposed on the front surface of the power module frame 100. The size of the AC socket 400 depends on the size of the input AC power, and the size of the AC power source depends on the amount of power. Recently, as the power capacity of power modules increases, large AC power sources and large size AC sockets are required.

The fan module 600 is disposed on the front surface of the power module 10, and the size of the AC socket 400 being disposed in the remaining area is maximally secured, but the lever 300 and the LED 500 may be disposed together. In order to maximally secure the size of the AC socket 400 without increasing the overall size of the power module 10, the length in a vertical direction may be formed to be longer than the length in a horizontal direction from the front surface of the AC socket 400. As the large size AC socket 400 is applied, since it is difficult to secure both of the space where the lever hook 311 is inserted inward and the space where the lever 300 can be stroked between the AC socket 400 and the side plate 110 of the power module frame 100, the handle 340 of the lever 300 is disposed on the bottom surface of the AC socket 400 and the lower plate 120 side of the power module frame 100 to efficiently utilize the space. In addition, without providing a separate space in front of the power module 10, the space being formed between the AC socket 400 and the side plate 110 of the power module frame 100, that is, the fixed space of the lever 300, is disposed together with the LED 500 to efficiently utilize the space.

The lever 300 is disposed at a lower portion of the AC socket 400, and the LED 500 may be disposed on a side portion of the AC socket 400. The bracket 200 supporting the LED 500 and the first plate 310 of the lever 300 is in contact with a first surface of the AC socket 400, the second plate 320 of the lever 300 maybe be in contact with a second surface of the AC socket 400, and the first surface and the second surface of the AC socket 400 may be vertically disposed.

The AC socket 400 may be spaced apart from the side plate 110 of the power module frame 100 by a predetermined distance. The predetermined distance D1 between the AC socket 400 and the side plate 110 may be larger than the length D2 of which the lever hook 311 being protruded from the first plate 310 of the lever 300 in a direction perpendicular to the first plate 310. This is to secure a space where the lever hook 311 is inserted into the power module frame 100 when the handle 340 of the lever 300 is moved toward an inner side direction which is perpendicular to the side plate 110 of the power module frame 100. A predetermined distance D1 between the AC socket 400 and the side plate 110 may be larger than the diameter D3 of an LED 500. An LED hole 112 may be formed between the AC socket 400 and the side plate 110, and the LED 500 may be inserted into the LED hole 112 and supported.

The power module 10 may include a bracket 200. The bracket 200 may support the LED 500. The bracket 200 may support the LED 500 so as to be protruded out of the power module frame 100.

The bracket 200 may include a support 230 for supporting the LED 500. The support portion 230 where the bracket 200 is formed at a position facing the front surface of the power module frame 100 is formed in a shape corresponding to the outer circumferential surface of the LED 500 to support the LED 500. The support portion 230 may include a fixing groove 231. In the LED 500, a flange 501 may be formed at a portion where epoxy and a lead wire are coupled. The flange 501 of the LED 500 may have a larger outer circumferential surface than the outer circumferential surface of the epoxy of the LED 500. The fixing groove 231 of the support 230 may be formed in a shape corresponding to the flange 501 of the LED to support the LED 500. The LED 500 may be fit-coupled to the fixing groove of the support 230. Thus, within the bracket 200, the LED 500 can be fixed or supported without being separated in the front and rear directions.

The LED 500 may externally display the operating state of the power module 10. The LED 500 can emit green or yellow (amber) colors and can be transformed into various colors. The LED 500 may be turned on in a specific color and may blink at a specific cycle. The user can check the operating state of the power module 10 by looking at the state of the LED 500, and can take action accordingly.

The bracket 200 may be coupled to the side plate 110 of the power module frame 100. The bracket 200 may be slidably coupled to the side plate 110 toward the front surface of the power module frame 100. The side plate of the power module frame 100 may include a bracket coupling plate 114 in which a bracket groove 111 is formed. The bracket groove 111 may be formed in a shape corresponding to the bracket hooks 211 and 221. The bracket coupling plate 114 may be protruded in a wing shape from the side plate 110 of the power module frame 100 in an inward direction. The bracket coupling plate 114 may be formed by being bent from the side plate 110 of the power module frame 100 toward an inner side direction of the power module frame 100.

The upper surface 210 of the bracket 200 may include a first bracket hook 211. The first bracket hook 211 may be coupled to the bracket groove 111 being formed in the bracket coupling plate 114. The first bracket hook 211 may be formed by being protruded from the upper surface 210 of the bracket 200. The first bracket hook 211 may include: a first surface 211a parallel to the upper surface 210 of the bracket 200; and a second surface 211b on which a downwardly inclined surface is formed in a direction in which the bracket 200 is slidingly coupled. When the bracket 200 is slidingly coupled to the bracket coupling plate 114, it can be easily coupled through the second surface 211b, and an end portion of the first surface 211a may be fit-coupled into the bracket groove 111. One end portion of the first bracket hook 211 is fit-coupled to the bracket groove 111 so that movement in a rearward direction may be restricted.

The lower surface 220 of the bracket 200 is symmetrical with the upper surface 210 of the bracket 200 about the body of the bracket 200, and the lower surface 220 of the bracket may include a second bracket hook 221. A description of the second bracket hook 221 may be replaced with a description of the first bracket hook 211.

A first tension groove 212 may be formed between the upper surface 210 of the bracket 200 and the body 240. The first tension groove 212 being formed spaced apart at a predetermined interval may be included between the upper surface 210 of the bracket 200 and the body 240. The first tension groove 212 may be formed in a predetermined space so that the upper surface 210 of the bracket 200 can be elastically movable toward the body 240 side when the first bracket hook 211 is slidingly coupled into the bracket groove 111.

A second tension groove 222 may be formed between the lower surface 220 of the bracket 200 and the body 240. A second tension groove 222 being formed at a predetermined interval may be included between the lower surface 220 of the bracket and the body. The second tension groove 222 may be formed in a predetermined space so that the lower surface 220 of the bracket 200 is elastically movable toward the body 240 side when the second bracket hook 221 slidingly coupled into the bracket groove 111.

The power module 10 may include a lever 300. The lever 300 is a component for coupling the power module 10 to a device included in the data center. When the handle 340 of the lever 300 is pulled in an inward direction perpendicular to the side plate of the power module frame 100, the lever hook 311 of the lever 300 can separate the power module 10 as it enters inside the power module frame 100, and when the lever hook 311 is being protruded from the power module frame 100 as the handle of the lever 300 is returned in place, it can be coupled to a device being included in the data center.

The lever 300 may include a first plate 310, a second plate 320, a third plate 330, and a handle 340. The first plate 310 may be disposed parallel to the side plate of the power module frame 100. The first plate 310 may be in contact with the side plate 110 of the power module frame 100. The first plate 310 may include at least one lever hook 311. The lever hook 311 is inserted into the lever groove 113 formed in the side plate 110 of the power module frame 100 and may be protruded to be exposed to the outside of the power module frame 100. The first plate 310 may include at least one hole 312. The hole 312 of the first plate 310 may correspond to a hole formed in the side plate 110 of the power module frame 100. The power module frame 100 and the lever 300 may be coupled by coupling a screw (not shown) in a hole formed at a corresponding position, or a portion of the power module frame 100 is bent and the bent portion (not shown) may be fixed and coupled in a manner of press fitting into/inside the one hole 312 of the first plate 310.

The second plate 320 may be vertically connected to the first plate 310. The second plate 320 may be disposed parallel to the lower plate 120 of the power module frame 100. The second plate 320 may be in contact with the lower plate 120 of the power module frame 100. A first connecting portion 313 may be disposed between the lower end of the first plate 310 and the second plate 320. Since the second plate 320 may be disposed while forming a step with the lower end of the first plate 310, the second plate 320 may be connected to the first plate 310 by the first connecting portion 313. The second plate 320 may be disposed in a space formed between the AC socket 400 and the lower plate 120 of the power module frame 100, and may be freely moved within the space.

The third plate 330 may be connected to the second plate 320 and may be disposed to be exposed to the outside of the power module frame 100. A second connecting portion 321 may be disposed between the third plate 330 and the second plate 320. Since the third plate 330 and the second plate 320 may be disposed while forming a step difference, the third plate 330 may be connected to the second plate by the second connecting portion 321. The third plate 330 may include a holding portion 331 being formed in a vertical direction. When AC power is inserted into the AC socket 400, the movement of the lever 300 may be limited by the AC power and the holding portion 331. Through this, it is possible to prevent the power module 10 from being separated from devices included in the data center while the power module is operating with AC power inserted. That is, when the lever 300 is moved when AC power is inserted into the AC socket 400, the holding portion 331 of the lever 300 is caught in the AC power, so that it helps to maintain the state in which the power module 10 is coupled to the data center.

The handle 340 may be connected to the third plate 330. The handle 340 is a part that the user grips when moving the lever 300 and may be made of a material that does not conduct current to prevent electric conduction or electric shock, but is not particularly limited thereto.

Although the embodiment of the present invention has been described above with reference to the accompanying drawings, those of ordinary skill in the art to which the present invention belongs will understand that the present invention may be embodied in other specific forms without changing the technical spirit or essential features thereof. Therefore, it should be understood that the embodiments described above are illustrative in all respects and not restrictive.

The invention claimed is:

1. A power module comprising:
   a power module frame comprising a side plate and a lower plate;
   a bracket having a bracket hook coupled to the side plate;
   a light-emitting element coupled to the bracket; and
   a lever disposed on the lower plate,
   wherein the side plate comprises a bracket groove, to which the bracket hook is coupled, and a lever groove through which a part of the lever passes, and
   wherein the lever comprises a first plate having a lever hook inserted in the lever groove, a second plate connected perpendicularly to the first plate, and a handle connected to the second plate.

2. The power module according to claim 1, wherein the power module comprises an AC socket,
   wherein the bracket and the first plate of the lever are in contact with a first surface of the AC socket, and
   wherein the second plate of the lever is in contact with a second surface of the AC socket.

3. The power module according to claim 2, wherein the lever comprises a third plate disposed between the second plate and the handle, and
   wherein the third plate comprises a holding portion formed in a direction perpendicular to the third plate.

4. The power module according to claim 3, wherein when AC power is disconnected from the AC socket, the lever is movable in a direction perpendicular to the side plate of the power module, and
   wherein when the AC power is coupled to the AC socket, the movement of the lever is limited by the holding portion.

5. The power module according to claim 2, wherein the AC socket is disposed being spaced apart from the side plate of the power module by a predetermined distance, and
   wherein the predetermined distance is greater than a length at which the lever hook is protruded from the first plate in a direction perpendicular to the first plate.

6. The power module according to claim 2, wherein the first plate is disposed between the lower plate of the power module frame and the AC socket.

7. The power module according to claim 1, wherein the bracket coupling plate in which the bracket groove is formed is formed by being protruded inward from the side plate of the power module.

8. The power module according to claim 1, wherein the bracket hook is formed on at least one of an upper surface and a lower surface of the bracket, and
   wherein the bracket comprises a tension groove formed at predetermined intervals between at least one of the upper surface and the lower surface of the bracket and a body of the bracket.

9. The power module according to claim 1, wherein the bracket comprises a fixing groove into which a flange of the light emitting element is inserted and fixed.

10. The power module according to claim 1, wherein the bracket hook is formed with a downwardly inclined surface in a direction in which the bracket is slidingly coupled with the power module frame.

11. The power module according to claim 2, wherein the AC socket is disposed being spaced apart from the side plate of the power module by a predetermined distance, and
    wherein the predetermined distance is greater than a diameter of the light-emitting element.

12. The power module according to claim 1, comprising:
    at least one of a fan module, a PFC switch, and a DCDC converter inside the power module frame.

13. A power module frame comprising:
    a side plate and a lower plate;
    a bracket having a bracket hook coupled to the side plate;
    a light-emitting element coupled to the bracket; and
    a lever disposed on the lower plate,
    wherein the side plate comprises a bracket groove, to which the bracket hook is coupled, and a lever groove through which a part of the lever passes, and
    wherein the lever comprises a first plate having a lever hook inserted in the lever groove, a second plate connected perpendicularly to the first plate, and a handle connected to the second plate.

14. The power module frame according to claim 13, comprising an AC socket,
    wherein the bracket and the first plate of the lever are in contact with a first surface of the AC socket, and
    wherein the second plate of the lever is in contact with a second surface of the AC socket.

15. The power module frame according to claim 14, wherein the lever comprises a third plate disposed between the second plate and the handle, and
    wherein the third plate comprises a holding portion formed in a direction perpendicular to the third plate.

16. The power module frame according to claim 15, wherein when AC power is disconnected from the AC socket, the lever is movable in a direction perpendicular to the side plate, and wherein when the AC power is coupled to the AC socket, the movement of the lever is limited by the holding portion.

17. The power module frame according to claim 14, wherein the AC socket is disposed being spaced apart from the side plate by a predetermined distance, and wherein the predetermined distance is greater than a length at which the lever hook is protruded from the first plate in a direction perpendicular to the first plate.

18. The power module frame according to claim 14, wherein the first plate is disposed between the lower plate and the AC socket.

19. The power module frame according to claim 13, wherein the bracket coupling plate in which the bracket groove is formed is formed by being protruded inward from the side plate.

20. The power module frame according to claim 13, wherein the bracket hook is formed on at least one of an upper surface and a lower surface of the bracket, and wherein the bracket comprises a tension groove formed at predetermined intervals between at least one of the upper surface and the lower surface of the bracket and a body of the bracket.

* * * * *